United States Patent
Hoentschel et al.

(10) Patent No.: US 7,855,118 B2
(45) Date of Patent: Dec. 21, 2010

(54) DRIVE CURRENT INCREASE IN TRANSISTORS BY ASYMMETRIC AMORPHIZATION IMPLANTATION

(75) Inventors: Jan Hoentschel, Dresden (DE); Uwe Griebenow, Markkleeberg (DE); Vassilios Papageorgiou, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/423,106

(22) Filed: Apr. 14, 2009

(65) Prior Publication Data
US 2009/0298249 A1 Dec. 3, 2009

(30) Foreign Application Priority Data
May 30, 2008 (DE) .................. 10 2008 026 213

(51) Int. Cl.
*H01L 21/00* (2006.01)
(52) U.S. Cl. .............. 438/300; 438/303; 438/305; 438/585; 438/586; 257/E21.345; 257/E21.415; 257/E21.633; 257/E29.279; 257/E29.281
(58) Field of Classification Search .......... 438/300–306, 438/514, 585–596; 257/E21.345, 415, 633, 257/634, E29.279, 281
See application file for complete search history.

(56) References Cited

U.S. PATENT DOCUMENTS

| | | | | |
|---|---|---|---|---|
| 5,218,221 A * | 6/1993 | Okumura | ............... | 257/336 |
| 5,223,445 A * | 6/1993 | Fuse | ............... | 438/302 |
| 5,593,907 A * | 1/1997 | Anjum et al. | ............... | 438/298 |
| 5,793,090 A * | 8/1998 | Gardner et al. | ............... | 257/408 |
| 5,970,353 A * | 10/1999 | Sultan | ............... | 438/302 |
| 6,008,099 A * | 12/1999 | Sultan et al. | ............... | 438/305 |
| 6,245,622 B1 * | 6/2001 | Kawaguchi | ............... | 438/305 |
| 6,268,640 B1 * | 7/2001 | Park et al. | ............... | 257/607 |
| 6,284,630 B1 * | 9/2001 | Yu | ............... | 438/511 |
| 6,479,868 B1 * | 11/2002 | An et al. | ............... | 257/348 |
| 6,521,502 B1 * | 2/2003 | Yu | ............... | 438/305 |
| 6,576,965 B2 * | 6/2003 | Eikyu et al. | ............... | 257/408 |
| 6,682,980 B2 * | 1/2004 | Chidambaram et al. | ..... | 438/302 |
| 6,706,614 B1 * | 3/2004 | An et al. | ............... | 438/429 |
| 6,743,684 B2 * | 6/2004 | Liu | ............... | 438/300 |
| 6,767,831 B1 * | 7/2004 | Chu et al. | ............... | 438/682 |
| 6,774,436 B1 * | 8/2004 | Yu et al. | ............... | 257/347 |
| 6,846,708 B2 * | 1/2005 | Feudel et al. | ............... | 438/162 |
| 7,064,039 B2 * | 6/2006 | Liu | ............... | 438/300 |

(Continued)

FOREIGN PATENT DOCUMENTS

DE     10 2005 009 023 A1    9/2006

OTHER PUBLICATIONS

Translation of Official Communication from German Patent Office for German Patent Application No. 10 2008 026 213.7-33 dated Feb. 10, 2009.

*Primary Examiner*—Michael S Lebentritt
(74) *Attorney, Agent, or Firm*—Williams, Morgan & Amerson, P.C.

(57) ABSTRACT

By providing a substantially non-damaged semiconductor region between a pre-amorphization region and the gate electrode structure, an increase of series resistance at the drain side during the re-crystallization may be reduced, thereby contributing to overall transistor performance, in particular in the linear operating mode. Thus, symmetric and asymmetric transistor architectures may be achieved with enhanced performance without unduly adding to overall process complexity.

20 Claims, 6 Drawing Sheets

U.S. PATENT DOCUMENTS

| | | | |
|---|---|---|---|
| 7,071,069 B2 * | 7/2006 | Tan et al. | 438/306 |
| 7,105,412 B1 * | 9/2006 | Chen | 438/303 |
| 7,169,675 B2 * | 1/2007 | Tan et al. | 438/301 |
| 7,378,323 B2 * | 5/2008 | Chen | 438/303 |
| 7,410,876 B1 * | 8/2008 | Min et al. | 438/301 |
| 7,514,763 B2 * | 4/2009 | Hamaguchi | 257/607 |

* cited by examiner

DRIVE CURRENT INCREASE IN TRANSISTORS BY ASYMMETRIC AMORPHIZATION IMPLANTATION

BACKGROUND OF THE INVENTION

1. Field of the Invention

The present disclosure generally relates to the fabrication of integrated circuits, and, more particularly, to the adjustment of characteristics of individual field effect transistor elements to enhance the performance thereof.

2. Description of the Related Art

Integrated circuits typically include a large number of individual circuit elements, such as transistors, capacitors, resistors and the like. These individual circuit elements are electrically connected according to the desired circuit layout by respective conductive lines, which are mainly formed in separate "wiring" layers that are typically referred to as metallization layers. For enhancing the performance of the integrated circuit, usually the number of individual circuit elements is increased, thereby obtaining a more complex functionality of the circuit, and associated therewith the feature sizes of the individual circuit elements are reduced, thereby enhancing performance of the individual circuit elements, in particular of the transistors, which represent the dominant components in complex circuits.

Generally, a plurality of process technologies are currently practiced, wherein, for logic circuitry, such as microprocessors, storage chips and the like, MOS technology is presently the most promising approach due to the superior characteristics in view of operating speed, manufacturing costs and/or power consumption. During the fabrication of complex integrated circuits using MOS technology, millions of transistors, i.e., N-channel transistors and/or P-channel transistors, are formed in and on an appropriate crystalline semiconductor material, wherein, currently, the vast majority of logic circuitry is fabricated on the basis of silicon. Typically, a MOS transistor, irrespective of whether an N-channel transistor or a P-channel transistor is considered, comprises so-called PN junctions that are formed at an interface of highly doped drain and source regions, with a channel region disposed between the drain region and the source region, wherein the channel region is inversely or weakly doped with respect to the drain and source regions.

The conductivity of the channel region (which represents an essential device criterion, as the reduced current drive capability of scaled devices with reduced transistor width has to, at least partially, be compensated for by an increased conductivity) is controlled by a gate electrode formed above the channel region and separated therefrom by a thin insulating layer. The conductivity of the channel region depends on the dopant concentration, the mobility of the charge carriers and, for a transistor width, the distance between the source and drain regions, which is also referred to as channel length. In addition to the conductivity of the channel region in the saturated state and the linear operating state of the transistor, performance is also significantly influenced by the transistor's capability of rapidly creating a conductive channel in the channel region upon application of a specified control voltage to the gate electrode, since usually the transistors are operated in a switched mode requiring a fast transition from the transistor on-state to the transistor off-state and vice versa. Moreover, other aspects also have to be taken into consideration when designing a transistor of high performance circuit. For instance, static and dynamic leakage currents may significantly affect the overall performance of an integrated circuit, as the achievable amount of heat dissipation that is required for transistor architectures producing high dynamic and/or static leakage currents may restrict the maximum practical operating frequency.

Furthermore, sophisticated lateral and vertical dopant profiles may be required in the drain and source regions to maintain controllability of the channel region for a channel length of approximately 50 nm and significantly less, as is typically applied in modern transistor elements. As is well known, short channel effects may require a reduction of the thickness of the gate insulation layer which, however, may no longer be a viable option on the basis of silicon dioxide since, at a thickness of approximately 1 nm, significant leakage currents may occur, as explained above. Appropriate design countermeasures, on the other hand, may be accompanied by a reduction of channel conductivity, which has resulted in advanced strain engineering techniques for creating a desired type of strain in the channel region which may enhance charge carrier mobility therein. For example, for a standard crystallographic orientation of a silicon layer, i.e., a (100) surface orientation with the channel length directed along a <110> crystal axis, creating a tensile strain along the channel length direction may significantly enhance electron mobility, which thus leads to increased drive current capability of an NMOS transistor. Thus, a plurality of interdependent factors may finally determine the overall transistor characteristics, as will be described in more detail with reference to FIGS. 1a and 1b.

FIG. 1a schematically illustrates a cross-sectional view of a transistor element 100 at an early manufacturing stage. As illustrated, the transistor element 100 comprises a substrate 101, above which is formed a silicon-based semiconductor layer 102. The semiconductor layer 102 and the substrate 101 may be separated by a buried insulating layer 103, thereby providing a silicon-on-insulator (SOI) configuration. An SOI transistor architecture may have certain advantages relative to a "bulk" configuration in which the semiconductor layer 102 may represent an upper portion of a substantially crystalline substrate material so that electrical isolation between different transistors may require corresponding deep well regions and the like. On the other hand, in an SOI configuration, the buried insulating layer 103 may provide the vertical insulation, while appropriate isolation structures, such as shallow trench isolations (not shown), may laterally enclose the transistor 100, thereby laterally insulating the transistor 100 from neighboring circuit elements. For instance, by appropriately designing respective drain and source regions, the junction capacitance of the corresponding PN junctions may be reduced compared to bulk devices, thereby also providing enhanced operating speed. Furthermore, in the manufacturing stage shown, a gate electrode structure 104 is formed on the semiconductor layer 102 and comprises a gate insulation layer 104A, separating a gate electrode 104B from a portion of the semiconductor layer 102, which may be referred to as a channel region 102A. The gate electrode structure 104 further comprises a dielectric material or spacer elements 104C formed on sidewalls of the gate electrode 104B.

The transistor 100 as shown in FIG. 1a may be formed on the basis of the following well-established process techniques. The semiconductor layer 102 may be formed on the buried insulating layer 103 on the basis of well-established techniques, such as wafer bond processes and the like. Thereafter, photolithography, etch and deposition processes may be performed to define the lateral dimensions of an active region within the semiconductor layer 102 for the transistor 100 by providing appropriate isolation structures, as previously explained. Thereafter, implantation processes may be performed to position one or more dopants within the semiconductor layer 102 to thereby form a specified vertical dopant profile (not shown) according to the transistor characteristics of the device 100, which may finally result in a specified vertical dopant profile in the channel region 102A. Next, material layers for the gate insulation layer 104A and the gate electrode 104B may be formed, for instance, by advanced oxidation and/or deposition techniques for the gate insulation material and by advanced low pressure chemical vapor deposition (CVD), if a polycrystalline silicon material is used. Thereafter, highly sophisticated lithography and etch techniques may be employed to pattern the gate electrode material and the gate dielectric material to form the gate electrode 104B and the gate insulation layer 104A on the basis of a desired design gate length, which may be 50 nm and less in sophisticated applications. Subsequently, a complex implantation sequence may be performed to prepare the semiconductor layer 102 for establishing a desired vertical and lateral dopant profile adjacent to the channel region 102A. For this purpose, a so-called pre-amorphization implantation process 105 is performed during which a non-doping ion species, such as germanium and the like, may be implanted into the semiconductor layer 102 to substantially completely destroy the crystalline lattice structure down to a specified depth, thereby forming substantially amorphized regions 106. During the implantation process 105, the process parameters, such as implantation energy for the species under consideration and the ion beam current, may be adjusted to obtain sufficient lattice damage in the region 106, which may reduce channeling effects during a subsequent implantation process and which may also enhance the re-crystallization and activation of dopant atoms. Thereafter, the further processing may be continued by introducing dopant species in order to define respective drain and source regions and the corresponding lateral and vertical shape and the respective dopant gradients at the PN junctions. For example, a dopant species generating the same conductivity type as the basic doping in the semiconductor layer 102 may be introduced by any appropriate implantation techniques, possibly by using a tilt angle in order to form so-called halo regions (not shown) to enable an adjustment of the dopant gradient in combination with a dopant species of opposite conductivity type that may be introduced for forming drain and source regions.

FIG. 1*b* schematically illustrates the device 100 in a substantially completed manufacturing state. Thus, the device 100 may comprise a source region 108, which may include an extension region 108E, i.e., a shallow doped region connecting to the channel region 102A, thereby defining a PN junction with this region, when enrichment type transistors are considered. In the example shown, the transistor 100 may be assumed to represent an N-channel transistor so that the channel region 102A may be lightly P-doped, while the source region 108 and a drain region 107 are heavily N-doped. As illustrated, the drain region 107 may also include an extension region 107E which may have a symmetric configuration with respect to a lateral offset or overlap with respect to the gate electrode 104B. In this case, the terms drain and source may be interchangeable and may be defined by respective voltages supplied to the transistor 100 during operation. Furthermore, the source and drain regions 108, 107 may comprise deeper portions 108D, 107D which may extend down to the buried insulating layer 103, thereby providing a reduced junction capacitance, as previously explained. In the manufacturing stage shown, the drain and source regions 107, 108 may be in a substantially crystalline state so that the previously created substantially amorphized portions 106 are re-grown in a substantially crystalline state. Furthermore, the device 100 may comprise a spacer structure 109 which may include one or more individual spacer elements 109A, 109B, possibly in combination with respective etch stop materials 109C, 109D. For example, the spacer elements 109A, 109B may be comprised of silicon nitride while the etch stop liners 109C, 109D, if provided, may be comprised of silicon dioxide. Furthermore, the gate electrode structure 104 may comprise a metal silicide region 104D, which may be formed commonly with metal silicide regions 110 provided in the drain and source regions 107, 108.

The extension regions 107E, 108E may be formed by an ion implantation process within the substantially amorphized regions 106, as previously explained, possibly in combination with respective halo implantation processes so as to obtain the desired dopant gradient. Thereafter, in some manufacturing strategies, the device 100 may be annealed to activate the dopants in the extension regions 107E, 108E, while, in other cases, the process may be continued by forming the spacer structure 109, or at least a portion thereof. For example, the etch stop liner 109C may be deposited, followed by the deposition of a silicon nitride material, which may subsequently be patterned in order to obtain the spacer element 109A. Using the gate electrode structure 104 and the spacer element 109A as an implantation mask, a further portion of the deep drain and source regions 107D, 108D may be formed on the basis of appropriately set implantation parameters. Thereafter, the spacer element 109B may be formed, possibly using the etch stop liner 109D, and a further portion of the deep drain and source regions 107D, 108D may be provided by ion implantation. Next, the device 100 may be annealed to activate the dopants introduced by the preceding implantation sequences, thereby placing a high amount of dopant atoms at lattice sites, while also substantially re-crystallizing implantation-induced lattice damage. For example, if the anneal process may represent the first anneal process of the manufacturing sequence, also the extension regions 107E, 108E may be activated and the previously substantially amorphized regions 106 may be re-crystallized. During the anneal process, a desired final lateral offset or overlap of the extension regions 107E, 108E with the gate electrode 104B may be adjusted, while also the vertical dopant concentration may be driven down to the buried insulating layer 103. That is, during the anneal cycle, thermally induced diffusion of the dopants occurs in accordance with the respective concentration gradient of the dopant species under consideration, thereby substantially determining the finally obtained size and characteristics of the drain and source regions 107, 108. Thereafter, the manufacturing process may be continued with the formation of the metal silicide regions 110, 104D, which may be accomplished by depositing a refractory metal and initiating a chemical reaction with the underlying silicon material. Subsequently, an interlayer dielectric material may be formed and respective contacts may be provided to provide electrical connections to the drain and source regions 107, 108 and the gate electrode structure 104. For convenience, these components are not shown in FIG. 1*b*. During operation of the device 100, typically, a supply voltage is applied to the drain region 107 and the source region 108, for example approximately 1.5-5.0 volts for typical CPUs, while a corresponding control voltage is applied to the gate electrode 104B in order to define the status of the channel region 102A. For an N-channel enhancement transistor, upon application of a control voltage to the gate electrode 104B below a specified threshold voltage, which is determined, among others, by the vertical dopant profile within the channel region 102A, the transistor 100 is in an off state, that is, the channel region 102A is not conductive and one of the PN junctions is reversed bias. However, during the off state, the moderately high electrical field prevailing at the drain side, and in particular at the overlap between the extension region 107E and the gate electrode 104B, may lead to tunnel currents into the gate electrode 104B, especially when the gate insulation layer 104A has a thickness of approximately 2 nm and less. These currents may be considered as static leakage currents and may significantly contribute to overall power consumption in sophisticated devices. Moreover, the extension region 107E and the gate electrode 104B may define a capacitor which has to be charged and discharged when operating the transistor 100 in a switched mode, wherein the transistor 100 may also transit through a linear operating mode in which the drain current may be substantially proportional to the effective gate voltage that is determined by the charge state of the corresponding parasitic capacitor.

When applying a control voltage that is above the threshold voltage, a conductive channel is formed in the channel region 102A originating from the source extension region 108E and terminating at the drain extension region 107E. For building up a conductive channel, in the present case created by electrons, an overlap at the source side and a steep concentration gradient at the source side may be advantageous in obtaining a high drive current. However, the steep concentration gradient at the drain side may result in increased creation of electron hole pairs, thereby increasingly creating holes at the body region of the transistor 100, i.e., in the region between the deep drain and source regions 107D, 108D. The accumulated charge carriers may have to be discharged, thereby also contributing to increased dynamic leakage currents. Moreover, during the formation of the conductive channel, the parasitic capacitance caused by the overlapping extension regions 107E, 108E may require high currents for recharging the parasitic capacitor and may thus delay the start of the on state so that, during the substantially linear operating mode, when charging the parasitic capacitor, a moderately high on resistance may be observed in the transistor 100. For this reason, asymmetric transistor configurations with respect to the drain and source regions have been proposed, for instance, by providing a certain offset between the drain extension region 107E and the gate electrode 104B in order to enhance overall transistor performance. Furthermore, as previously explained, various strain-inducing mechanisms may be used to create a desired type of strain in the channel region 102A, thereby also increasing electron mobility or hole mobility, depending on the conductivity type of the transistor under consideration, thereby also increasing the drive current capability. As may be evident from the above discussion, in addition to the overall geometric configuration of the transistor 100, such as transistor length and width, as well as material compositions, dopant concentrations and the like, also the lateral and vertical dopant profiling within the semiconductor layer 102, possibly in combination with any strain-inducing mechanisms, significantly affects the finally achieved transistor performance. Despite sophisticated manufacturing techniques, a less pronounced gain in transistor performance may be observed in sophisticated devices, in particular in the linear operating mode, thereby contributing to increased power consumption and/or reduced operating speed of the entire integrated circuit.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods for enhancing transistor performance by creating an asymmetric configuration during a pre-amorphization process such that, at a drain side of the transistor, an increased lateral offset of semiconductor regions may not be damaged during the amorphization implantation, thereby reducing the overall series resistance at the drain side of the transistor. The increased lateral offset of the substantially non-damaged semiconductor region may have an even more pronounced effect in combination with stress memorization techniques, in which highly damaged or substantially amorphous semiconductor regions in the vicinity of the channel area of the transistor are re-grown in the presence of a cap layer, such as a silicon nitride material in an appropriate strain state so that enhanced charge carrier mobility in the channel region may be accomplished while not unduly contributing to enhanced overall series resistance at the drain side, which may otherwise result in less pronounced performance gain. In some illustrative aspects, the increased offset of the non-damaged semiconductor region at the drain side may be formed on the basis of a tilted pre-amorphization implantation process, during which the shadowing or shielding effect of the gate electrode structure may result in combination with an appropriately selected tilt angle for a desired asymmetric offset substantially without adding additional process complexity. In other cases, the gate electrode structure may be provided with an asymmetrically provided non-electrode material at sidewall portions thereon so as to obtain a desired asymmetric offset while at the same time providing flexibility in selecting appropriate implantation parameters. The increased area of non-damaged semiconductor material adjacent to the gate electrode structure at the drain side may be used for otherwise symmetric transistor architectures, i.e., in transistors having a substantially symmetric configuration of the drain and source areas with respect to their lateral offset to the gate electrode, and may also be advantageously applied to asymmetric transistor architectures, in which at least the drain and source extension regions have a different lateral spatial relationship with respect to their position relative to the gate electrode structure in order to enhance overall transistor configuration, for instance with respect to some of the above-identified problems. Thus, for an asymmetric transistor configuration in which, for instance, an overlap of the drain extension region with the gate electrode may be avoided or at least reduced, thereby, however, increasing the series resistance for the benefit of a reduced parasitic capacitance, the asymmetric configuration of the pre-amorphization process, i.e., the provision of a substantially non-damaged semiconductor area immediately adjacent to the gate electrode structure, may therefore reduce the increase in series resistance compared to conventional strategies, thereby even further pronouncing specific advantages of an asymmetric transistor configuration. Consequently, overall transistor performance, in particular in the linear operating mode, may be enhanced while substantially not contributing to additional process complexity when the asymmetric behavior of the pre-amorphization process may be accomplished on the basis of a tilted ion beam.

One illustrative method disclosed herein relates to the formation of a transistor. The method comprises forming a first substantially amorphized region in a source area and a second substantially amorphized region in a drain area of a semiconductor region having formed thereon a gate electrode structure which comprises a gate electrode and a first non-electrode material formed on a first sidewall of the gate electrode facing a source side of the transistor. The gate electrode structure further comprises a second non-electrode material formed on a second sidewall that faces a drain side of the transistor, wherein a lateral distance of the second substantially amorphized region from the gate electrode is greater than the width of the first non-electrode material. Furthermore, the method comprises forming drain and source regions in the semiconductor region by implanting at least one dopant species.

A further illustrative method disclosed herein comprises implanting an amorphizing species into a source area and a drain area of a transistor by using a tilt angle to obtain a lateral offset of the amorphizing species to a gate electrode structure at a drain side of the transistor. The method further comprises forming drain and source regions of the transistor.

A still further illustrative method disclosed herein comprises forming a first substantially amorphized region and a second substantially amorphized region in a semiconductor region having formed thereon a gate electrode structure, wherein the first and second substantially amorphized regions are asymmetric with respect to a lateral offset to the gate electrode structure. The method additionally comprises forming drain and source regions in the semiconductor region and forming a cap layer above the semiconductor region. Furthermore, the method comprises annealing the semiconductor region in the presence of the cap layer to substantially re-crystallize implantation-induced lattice damage in the first and second substantially amorphized regions.

BRIEF DESCRIPTION OF THE DRAWINGS

The disclosure may be understood by reference to the following description taken in conjunction with the accompanying drawings, in which like reference numerals identify like elements, and in which.

Figure 1A:
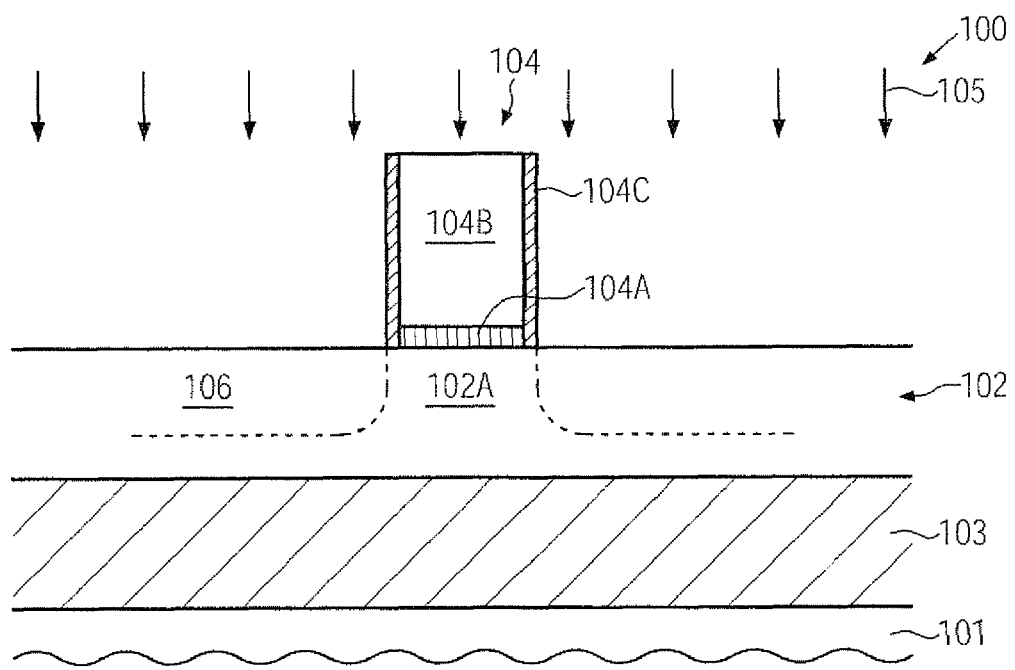
FIGS. 1a-1b schematically illustrate cross-sectional views of a conventional transistor element during various manufacturing stages wherein drain and source regions are formed on the basis of a pre-amorphization implantation.
Figure 1B:
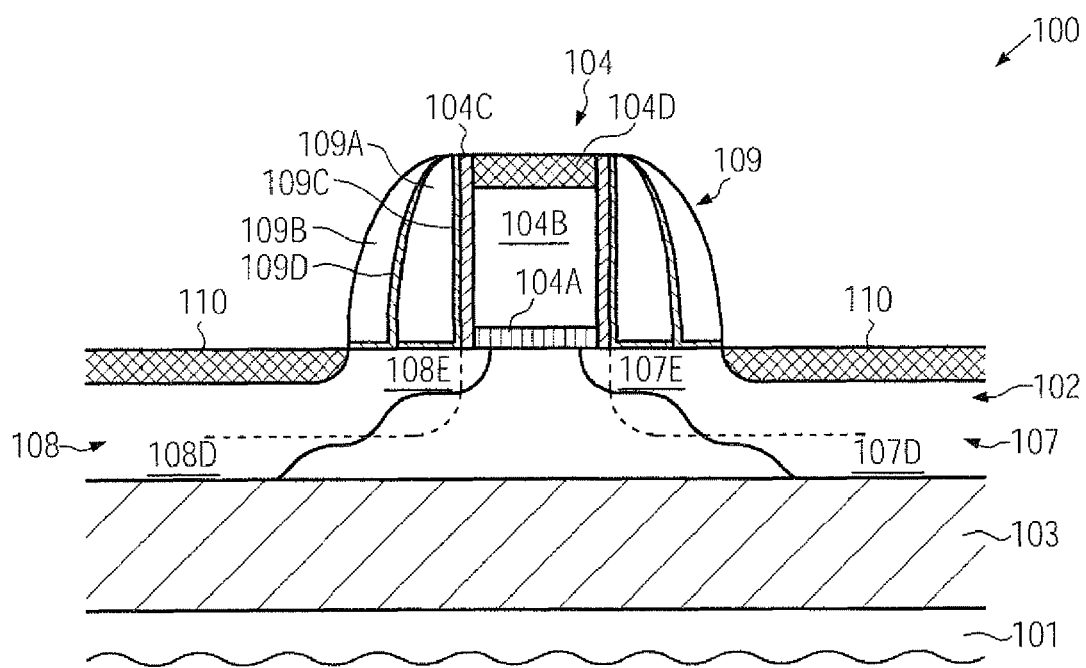

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques for enhancing overall transistor performance by providing a "buffer region" at the drain side of the gate electrode structure which may substantially remain undamaged during a pre-amorphization implantation process which, in some illustrative embodiments, may be advantageously combined with a stress memorization technique, thereby avoiding undue increase of the series resistance at the drain side of the transistor. Without intending to restrict the present application to the following explanation, it is believed that, in particular, in combination with stress-inducing mechanisms, such as a strained re-crystallization of highly damaged semiconductor regions in the presence of an appropriate cap layer, such as a silicon nitride material and the like, in a more-or-less strained state, may result in reduced conductivity immediately adjacent to the channel region, which may generally have an enhanced conductivity due to the strain-inducing mechanism. Consequently, by providing the buffer region with a significantly reduced degree of crystal damage, the re-crystallization may therefore result in increased crystal quality, which may translate into a reduced series resistance compared to conventional strategies in which the pre-amorphization process may involve the semiconductor material immediately adjacent to the gate electrode structure or may even result in a certain overlap when a tilt angle from both the drain side and the source side is used. Moreover, as previously indicated, frequently, asymmetric transistor architectures may be used, for instance, by asymmetrically adjusting the dopant profiles at the source side and the drain side for providing a steep and high dopant gradient at the source side with a significant overlap with the gate electrode while reducing the offset or providing an offset, possibly in combination with a reduced dopant gradient at the drain side in order to reduce the parasitic capacitance at the drain side, while also providing an efficient initial phase for building up the conductive channel from the source side, as previously explained. In this manner, static and dynamic leakage currents may be reduced. By also taking into consideration the negative effects of conventional approaches with respect to forming the substantially amorphized regions in the drain and source areas, for instance with respect to enhancing efficiency of stress memorization techniques, reducing channeling effects and the like, the corresponding increase of series resistance at the drain side may be reduced by providing the buffer region, i.e., a semiconductor region adjacent to the drain side of the gate structure, with significantly reduced lattice damage, which may therefore reduce the increase of series resistance, which may be accompanied by the generally asymmetric transistor architecture. Consequently, the advantages of an asymmetric transistor architecture may be further pronounced by applying the principles disclosed herein. On the other hand, for a basically symmetric transistor architecture, the asymmetric generation of the substantially amorphized regions at the source side and the drain side may result in enhanced drive current capability while maintaining the advantages associated with symmetric transistor architecture, for instance with respect to transistor orientation in the semiconductor chip and the like.

In some illustrative embodiments, the desired offset at the drain side may be obtained by performing the pre-amorphization process as a tilted implantation process by using an appropriate tilt angle range such that the gate electrode structure may provide the shielding effect so that additional process complexity may be substantially avoided, except for a minor adaptation of implantation parameters, such as implantation energy. In other cases, the gate electrode structure may receive a non-electrode material in an asymmetric manner, at least prior to the pre-amorphization implantation, so that an offset of the substantially amorphized region with respect to the gate electrode material may be greater at the drain side compared to the source side, wherein, in some illustrative embodiments, the asymmetric configuration of the non-electrode material may be maintained throughout the entire manufacturing process for completing the basic transistor structure, or at least a significant portion thereof, thereby also providing an asymmetric transistor architecture without requiring additional process modifications. In some illustrative embodiments the asymmetric pre-amorphization implantation process may be combined with stress memorization techniques and also with shallow implantation of non-doping species, such as carbon and the like, which may be advantageous in adjusting the overall transistor characteristics, for instance with respect to leakage currents and the like, wherein the incorporation of the shallow non-doping species may also be based on an asymmetric configuration, for instance by using a tilted implantation process. Consequently, in particular during the linear operating mode of the transistor, for instance during a respective transient phase or for transistors that may generally be operated at or near the linear operating mode, a significant reduction of the series resistance and thus increase of the drive current may be obtained for both asymmetric and symmetric transistor architecture with respect to the drain and source regions.

Figure 2A:
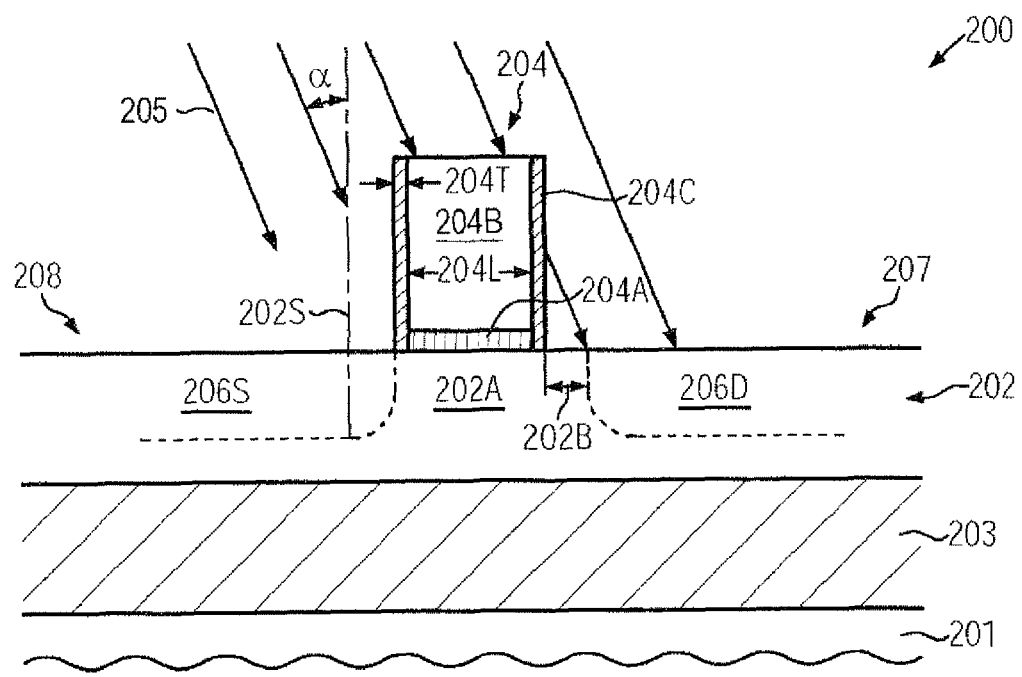
FIG. 2a schematically illustrates a cross-sectional view of a transistor device at an early manufacturing stage in which a tilted pre-amorphization implantation process may be performed to reduce series resistance at a drain side, according to illustrative embodiments.

FIG. 2a schematically illustrates a cross-sectional view of a transistor 200 at an early manufacturing stage. The transistor 200 may comprise a substrate 201 above which is formed a semiconductor layer 202 which may typically be provided in the form of a silicon-based material, i.e., a semiconductor material having incorporated therein a significant amount of silicon, while other components, such as germanium, carbon, dopants and the like, may also be present. It should be appreciated, however, that the principles disclosed herein may also be applied to any semiconductor compound in which an amorphization process may provide significant advantages with respect to overall transistor behavior. In the embodiment shown, the transistor 200 may represent an SOI configuration in which a buried insulating layer 203, for instance in the form of silicon dioxide, may be provided between the semiconductor layer 202 and the substrate 201. In other embodiments, the buried insulating layer 203 may not be provided, at least in certain device areas of the substrate 201, if a bulk configuration may be considered advantageous. Also, in this case, the principles disclosed herein may be advantageously applied to a bulk configuration. Moreover, the transistor 200 may comprise a gate electrode structure 204 that may comprise a gate electrode 204B, for instance formed of any appropriate material, such as polysilicon in silicon-based devices, or other materials, such as metal-containing materials, for reducing overall resistivity of the gate electrode 204B, depending on the overall process strategy. The gate electrode structure 204 may further comprise a gate insulation layer 204A separating the gate electrode 204B from a channel region 202A. The material composition of the gate insulation layer 204A may be based on silicon oxide with a thickness of 2 nm or even less, while, in other cases, any other appropriate insulating material may be used that exhibits the desired insulation characteristics in combination with process compatibility and permittivity characteristics. For example, the gate insulation layer 204A may be comprised of nitrogen-enriched silicon dioxide, silicon dioxide, silicon nitride, or high-k dielectric materials, possibly in combination with one or more of the latter materials. As previously discussed, the dimensions of the gate electrode 204B, i.e., the length thereof, indicated as gate length 204L, as well as the height thereof and the thickness of the gate insulation layer 204A, may be selected in conformity with design requirements and are substantially determined by the design rules of a specified technology node. For example, in advanced transistor elements, the gate length 204L may be on the order of 50 nm and less. It should be appreciated, however, that the principles disclosed herein are advantageous in the context of sophisticated devices, while, in other cases, the teaching provided herein may be advantageously practiced in conjunction with less advanced transistor devices, if desired.

Furthermore, the gate electrode structure comprises a non-electrode material, for instance in the form of sidewall spacers 204C, for instance in the form of silicon dioxide, which, in the embodiment shown in FIG. 2a, may be provided in a substantially symmetric manner, i.e., a thickness 204T of the non-electrode material 204C may be substantially identical at a source side 208 and a drain side 207. Furthermore, a first substantially amorphized region 206S may be provided at the source side 208 of the semiconductor layer 202 and a second substantially amorphized region 206D may be provided at the drain side 207, wherein the regions 206S, 206D may be provided asymmetrically with respect to an offset to the gate electrode 204B. That is, as illustrated, at the drain side 207, a substantially non-damaged region 202B may be positioned between the region 206D and the channel region 202A, wherein it should be appreciated that the actual length of the channel region 202A may be defined in a later manufacturing stage when the respective drain and source extension regions may be formed. It should be appreciated that a substantially amorphized portion is to be understood as a semiconductor region of the layer 202 having incorporated therein a large number of crystal defects so as to destroy at least a long distance order of the lattice structure as may be provided in the remaining portion of the semiconductor layer 202. In some cases, even the near distance order may be significantly disturbed such that, for example, approximately 50-90 percent of the atoms in the regions 206D, 206S may no longer be positioned on regular lattice sites. It should be appreciated that a boundary between the region 202B and the region 206D at the drain side 207 may not represent a sharp boundary but may include a transition area in which the number of lattice defects may be reduced by at least two orders of magnitude. In some illustrative embodiments, the substantially amorphized regions 206S, 206D may differ in material composition from other portions, such as the region 202B, due to the presence of an amorphizing implantation species, such as xenon, germanium and the like, which may have been introduced by an ion implantation process 205 for creating the heavy lattice damage, as is also previously explained. For example, the regions 206D, 206S may have a transition area in which a corresponding concentration may drop by at least two orders of magnitude, which may thus be considered as the border of the regions 206D, 206S, wherein it should be appreciated that, due to the nature of an implantation process and due to subsequent anneal processes, a certain amount of the amorphizing species may also be present in neighboring device areas.

A typical process flow for forming the transistor element 200 as shown in FIG. 2a may comprise substantially the same process steps with respect to the gate electrode structure 204 as previously described with reference to the transistor 100. Thus, after the formation of the gate electrode 204B, the spacers 204C may be formed on the basis of well-established spacer techniques including, for instance, the conformal deposition of a specific material, such as silicon dioxide or silicon nitride, and a subsequent anisotropic etch process. It should be noted that the dimensions of the spacer 204C, i.e., the width 204T, may be selected so as to obtain a desired masking effect during the subsequent implantation sequence for forming drain and source extension regions, as will be described later on with reference to FIG. 2b. Next, the implantation process 205 may be performed for creating the substantially amorphized regions 206D, 206S in the asymmetric configuration as shown in FIG. 2a, which may be accomplished by using a specified tilt angle α for the ion beam of the process 205. That is, by tilting the ion beam with respect to the surface normal of the semiconductor layer 202, as indicated by 202S, the shadowing effect of the gate electrode structure 204 may result in a significantly reduced or substantially non-bombarded area, thereby creating the "buffer" region 202B. In some illustrative embodiments, the ion implantation process 205 may be performed on the basis of xenon, germanium, silicon and the like, which may provide heavy lattice damage at a moderately low dose, thereby providing enhanced cycle time during the processing of the device 200. Furthermore, by using a tilt angle α in the range of approximately 4-12 degrees with respect to the normal 202S from the source side 208, in combination with the height of the gate electrode structure 204, the lateral extension of the buffer region 202B may be adjusted. For instance, for typical gate electrode heights in the range of approximately 50-150 nm, the above-specified range for the tilt angle α may be appropriate, while, in other cases, a reduced range of 5-10 degrees may be selected. Furthermore, depending on the desired average penetration depth of the implant species, the implant energy may be appropriately adapted, for instance, by taking into consideration an increased effective thickness of the layer 202 when seen from the ion beam of the process 205 by 1/cos α. Hence, if a similar height as in conventional strategies may be desired, a respective adaptation of the implant energy may be used.

Figure 2B:
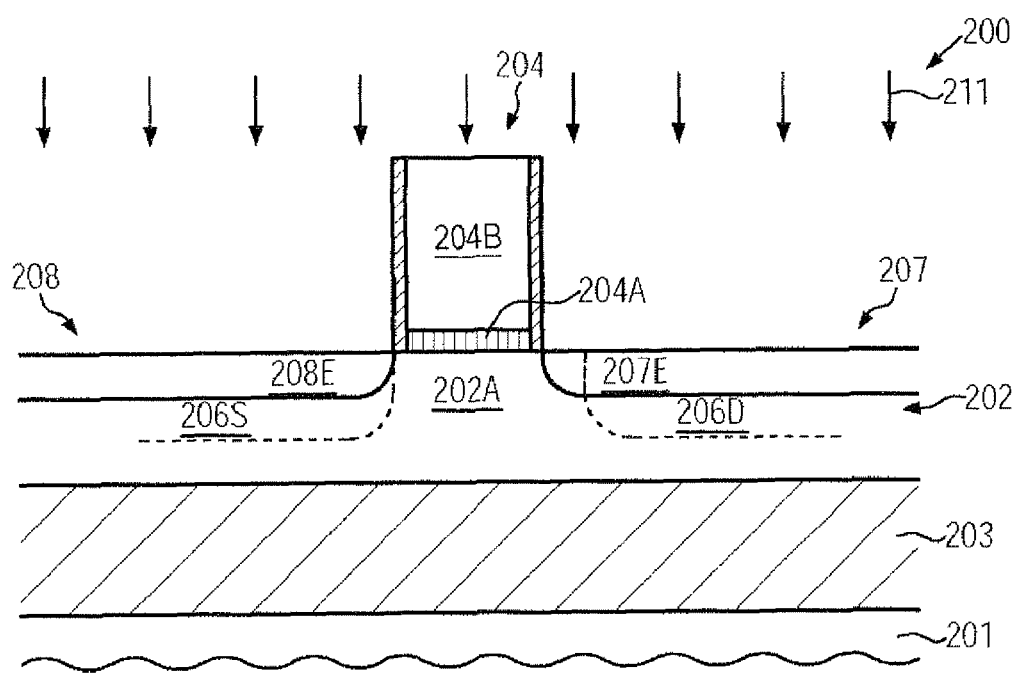
FIGS. 2b-2e schematically illustrate cross-sectional views of the transistor device of FIG. 2a during various manufacturing stages for completing the basic transistor structure, wherein a stress memorization technique is applied, according to further illustrative embodiments.

FIG. 2b schematically illustrates the device 200 during a further implantation process 211 for incorporating a dopant species to create a desired conductivity type in the drain and source regions 207, 208. For example, the device 200 may represent an N-channel transistor so that, during the implantation process 211, an N-type dopant species may be incorporated with a specified concentration and penetration depth in order to form respective drain and source extension regions 207E, 208E. It should be appreciated that the device as shown in FIGS. 2a and 2b may represent a "symmetric" transistor architecture in which the extension regions 207E, 208E may be provided in a symmetric manner with respect to an offset to the gate electrode 204B, while it should be noted, however, that a portion of the extension region 207E may be formed within the buffer region 202B, so that, generally, a reduced degree of lattice damage may be obtained at a portion of the extension region 207E immediately adjacent to the channel region 202A compared to the corresponding conditions at the source side 208. Furthermore, as previously explained, typically, halo regions (not shown in FIG. 2b) may be provided, for instance prior to or after the process 211, in order to adjust the dopant gradient at the corresponding PN junctions defined by the extension regions 207E, 208E. For this purpose, well-established process parameters may be used.

Figure 2C:
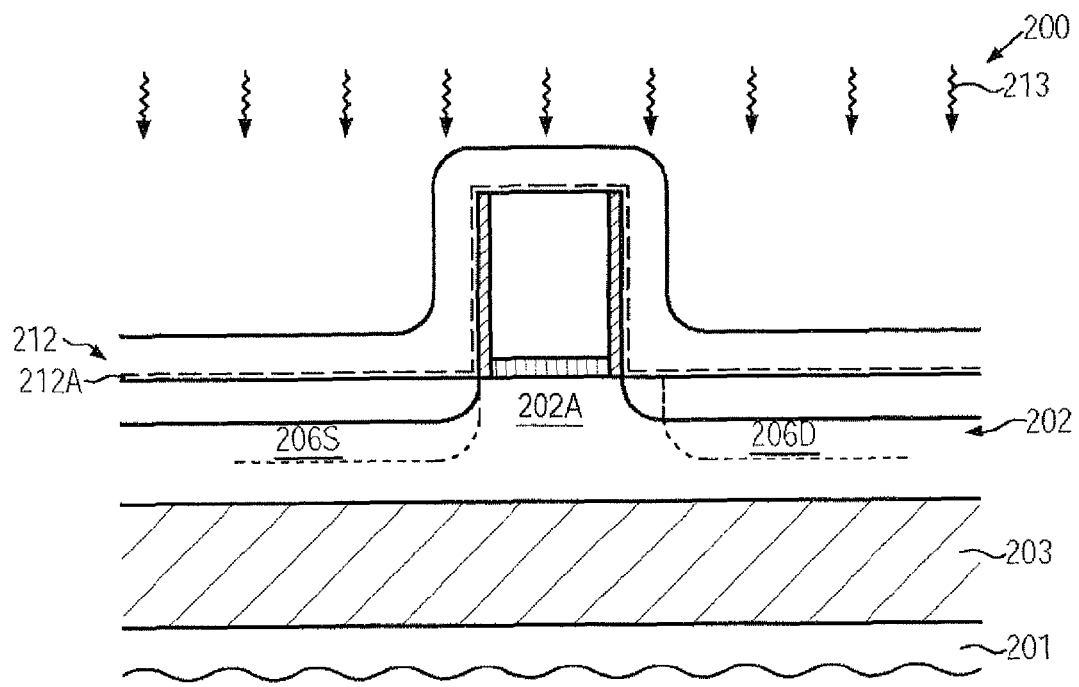

FIG. 2c schematically illustrates the semiconductor device 200 in a further advanced manufacturing stage. As previously explained, in sophisticated applications, the overall charge carrier mobility of the channel region 202A may be enhanced by providing an appropriately designed strain component therein, for which a plurality of strain-inducing mechanisms may be available. In one illustrative embodiment, a stress memorization technique may be applied, for instance after forming the extension regions 207E, 208E in combination with halo regions and additional shallow implants. For this purpose, in a stress memorization approach, heavy lattice damage may be re-crystallized on the basis of a cap layer, which may provide respective conditions for obtaining a highly strained state of the re-crystallized semiconductor material, wherein the strained state may be preserved to a high degree, even after removal or partial removal of the cap layer. Without intending to restrict the present application to the following explanation, it is believed that a "rigid" material as a cap material may establish or may maintain certain stress and strain conditions during the process of re-crystallizing the substantially amorphized portions on the basis of a template material provided by the surrounding crystalline regions. Consequently, the re-grown crystalline material has to connect to the template material in a strained state due to the overlying cap layer, which may thus be maintained after removal or partial removal of the cap material and which may thus transfer respective strain into the neighboring region, such as the channel region 202A, thereby also creating strain therein. For example, it is believed that the increase in volume upon substantially amorphizing an initially crystalline semiconductor material, this increased volume may be substantially maintained during a re-crystallization process in the presence of a cap material, such as silicon nitride, thereby creating tensile strain in the re-grown material, which may thus result in a tensile strain in the adjacent channel region. In other cases, the cap layer itself may provide respective strain conditions by providing the cap material as a highly stressed material so that the re-growth of the substantially amorphized portion may also take place under specific stress conditions, thereby resulting in a desired type of strain. Consequently, a cap layer 212, for instance in the form of silicon nitride, possibly in combination with an etch stop liner 212A, such as a silicon dioxide layer, may be formed above the transistor 200 and an anneal process 213 based on appropriately selected parameters, such as anneal temperature, which may be in the range of approximately 600-1200° C., depending on the overall process strategy, may be performed. As previously indicated, during the re-crystallization of the substantially amorphized portions 206D, 206S in a strained state, respective crystal defects may also be created wherein, due to the lateral offset of the region 206D at the drain side, a corresponding increase of the series resistance, which may be accompanied by the strained re-growth, may be reduced compared to conventional strategies. On the other hand, at the source side, respective defects may be less critical and may be overcompensated for by the enhanced strain-inducing mechanism and thus increased charge carrier mobility obtained by the created strain component.

Figure 2D:
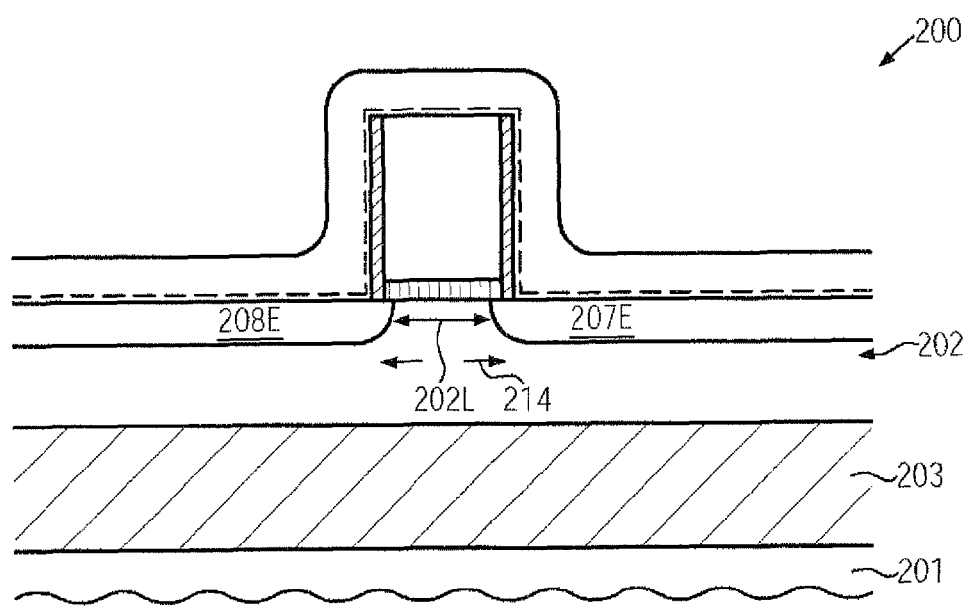

FIG. 2d schematically illustrates the transistor 200 after the anneal process 213, wherein the regions 206D, 206S are substantially re-crystallized thereby inducing a respective strain component 214 within the channel region 202A, wherein, in the present example, it may be assumed that a tensile strain component has been created. Furthermore, in some illustrative embodiments, during the anneal process 213, a respective dopant diffusion may be generated, if required, in order to actually adjust the effective channel length, indicated as 202L. In other cases, the process parameters during the anneal process 213 may be selected so as to substantially reduce dopant diffusion, if deemed inappropriate in the present manufacturing stage. For example, for this purpose, advanced laser-based or flashlight-based anneal sequences may be used in which the effective anneal time may be selected sufficiently short so as to suppress undue dopant diffusion while nevertheless providing a desired degree of re-crystallization. It should be appreciated that, in other illustrative embodiments, the anneal process 213 may be performed in a later stage together with the cap layer 212, for instance after performing additional implantation processes for incorporating further dopant species in order to define the deep drain and source areas. In other cases, the stress memorization technique may be applied two or more times, depending on the overall process strategy, for instance after a respective implantation process for incorporating dopant species so as to further enhance the overall magnitude of the strain 214. In some illustrative embodiments, after the anneal process 213, the cap layer 212 may be removed, while, in other illustrative embodiments, the cap layer 212 may also act as a spacer layer, from which appropriate spacer elements may be formed on sidewalls of the gate electrode structure 204 for the further processing of the transistor 200. That is, the cap layer 212 may be anisotropically etched, for instance using the optional etch stop liner 212A for controlling the etch process, thereby creating respective sidewall spacer elements, which in turn may be used in combination with the remaining gate electrode structure 204 as an implantation mask for defining the lateral dopant profile of the drain and source regions. Depending on the desired complexity of the lateral dopant profile, a further sequence for forming one or more further spacer elements may be performed to obtain the finally desired dopant profile. It should be appreciated that, in some illustrative embodiments, each of these sequences for introducing a dopant species may be combined with the deposition of a cap layer, which may also act as a spacer layer for a subsequent spacer element, and the implantation-induced damage may be re-crystallized in the presence of the cap layer to further enhance the overall strain component 214. For example, when introducing N-type dopant species with a high concentration so as to obtain the required degree of doping, significant lattice damage may be induced, thereby creating substantially amorphized portions which may then be efficiently re-crystallized in the presence of a cap layer, such as a silicon nitride layer. In other cases, additional amorphization implants may be used.

Figure 2E:
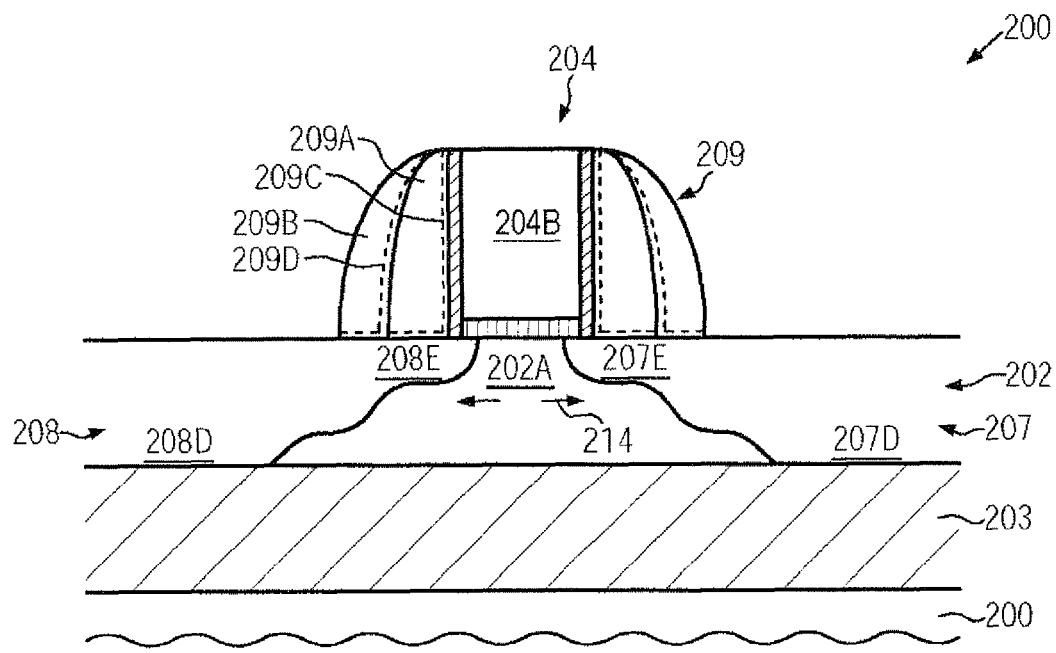

FIG. 2e schematically illustrates the transistor 200 in a further advanced manufacturing stage. As illustrated, a spacer structure 209 is formed at sidewalls of the gate electrode structure 204, wherein the spacer structure 209 may comprise a plurality of individual spacer elements, 209A, 209B, possibly in combination with corresponding etch stop liners 209C, 209D. As previously explained, in some illustrative embodiments, the spacer structure 209 may be formed on the basis of corresponding cap layers, such as the cap layer 212 and the optional etch stop liner 212A, as illustrated in FIG. 2c. In this case, for instance, the spacer element 209A and the associated etch stop liner 209C may represent the remaining portions of the cap layer 212 and the etch stop layer 212A. It should be appreciated that, in other illustrative embodiments, the spacer structure 209 may comprise a single spacer element if a less pronounced lateral dopant profile may be desired. In other cases, the etch stop liners 209C, 209D may be omitted, depending on the overall process strategy. Furthermore, deep drain and source portions 207D, 208D are formed in the drain and source regions 207, 208, which may be accomplished on the basis of well-established implantation processes in combination with the spacer structure 209, as is also previously explained. During corresponding anneal processes, if desired, respective stress memorization techniques may be applied, as previously discussed, thereby further enhancing the strain 214 in the channel region 202A. Furthermore, due to the asymmetric provision of the regions 206D, 206E, the series resistance from the channel region 202A to the drain region 207D may be reduced compared to conventional strategies, thereby enhancing overall drive current capability, in particular in the linear operating mode of the device 200, as also previously explained. Thus, efficient stress memorization techniques may be efficiently applied without unduly reducing overall transistor performance, in particular in the linear mode, while nevertheless providing a high degree of compatibility with conventional process techniques.

Figure 2F:
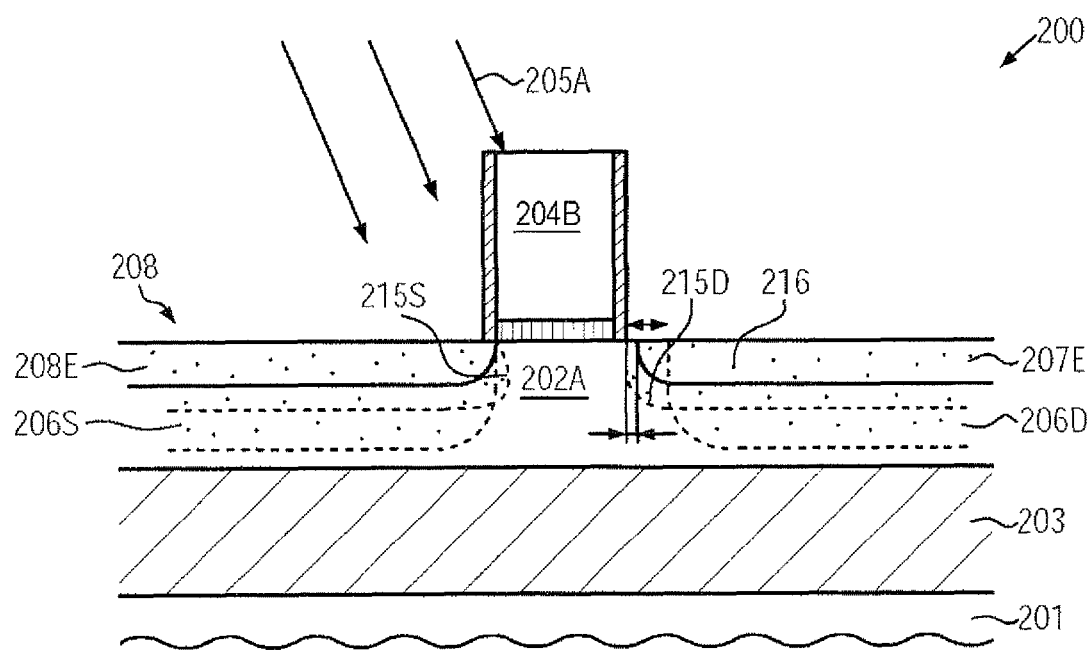
FIGS. 2f-2g schematically illustrate cross-sectional views of the transistor device according to an asymmetric transistor architecture during various manufacturing stages in which a tilted pre-amorphization implantation may further enhance performance gain of the asymmetric transistor configuration, according to further illustrative embodiments.
Figure 2G:
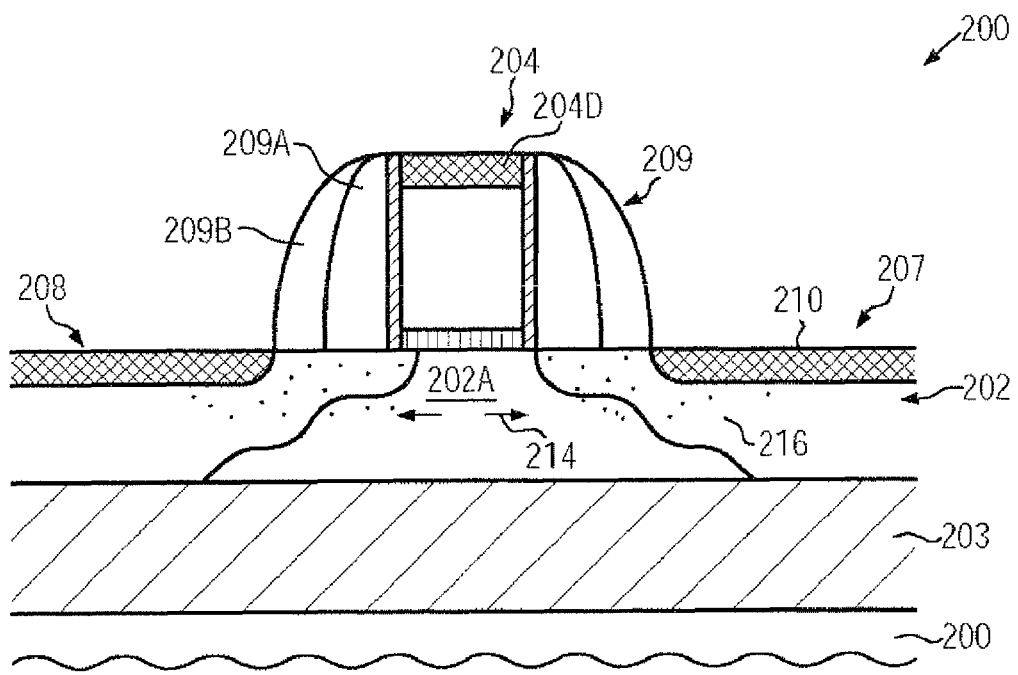

With reference to FIGS. 2f and 2g, further illustrative embodiments will now be described in which an asymmetric transistor configuration may be used in combination with a laterally offset substantially amorphized region at the drain side of the transistor.

FIG. 2f schematically illustrates the transistor 200 in a manufacturing stage in which an appropriate implantation sequence may be performed to establish an asymmetric transistor configuration. As illustrated, the transistor 200 may comprise the substantially amorphized portions 206D, 206S, wherein the region 206D may have a lateral offset to the gate electrode structure 204, as previously explained. Furthermore, halo regions 215S and 215D may be formed in the source side and the drain side of the transistor 200, which may be provided in a substantially symmetrical manner, as is typically the case in symmetric transistor architectures, as, for instance, described with reference to FIGS. 2a-2e, while, in other illustrative embodiments, as shown in FIG. 2f, the halo regions 215S, 215D may have an asymmetric configuration. For example, the halo regions 215S, 215D may be defined by a tilted implantation in order to create an asymmetric offset with respect to the gate electrode structure 204, similar as for the regions 206D, 206S, while, in other cases, an asymmetric configuration may be obtained by varying the dopant concentration for the drain side and the source side, possibly in combination with a different lateral offset. For example, the dopant concentration of the halo region 215D at the drain side 207 may be selected less compared to the region 215S in order to obtain less pronounced dopant gradients at the drain side. This may also be accomplished on the basis of a tilted implantation process and/or by using one or more implantation steps with non-tilted and tilted implantation steps. Moreover, as illustrated in FIG. 2f, the extension regions 207E, 208E may be provided in an asymmetric manner with respect to the lateral offset to the gate electrode 204B so as to reduce or avoid an overlap of the region 207E at the drain of the transistor 200, as previously explained. Moreover, in some illustrative embodiments, additional non-doping species, such as carbon and the like, may be incorporated as shallow implantation regions, as indicated by 216, wherein, in some illustrative embodiments, the non-doping regions 216 may be established on the basis of a tilted implantation process 205A, thereby also contributing to an overall asymmetric transistor architecture. It should be appreciated that the halo regions 215D, 215S, as well as the shallow non-doping implantations 216, may also be incorporated into the substantially symmetric transistor configuration as described with reference to FIGS. 2a-2e, wherein one or more of these implantation regions may also be established in an asymmetric manner, even if the transistor may be considered as symmetric configuration with respect to the extension regions 207E, 208E.

After the implantation 205A, the further processing may be continued as previously described, for instance by forming a sidewall spacer structure and implanting further dopant species and/or by providing a cap layer and annealing the device 200 as shown in FIG. 2f to induce a strain component, as previously described.

FIG. 2g schematically illustrates the asymmetric transistor 200 in a further advanced manufacturing stage. As illustrated, the sidewall spacer structure 209 may be formed on sidewalls of the gate electrode structure 204 and may comprise one or more individual spacer elements 209A, 209B, depending on the overall device requirements. Furthermore, the drain and source regions 207, 208 may be provided in an asymmetric configuration, for instance, an overlap at the drain side may be reduced or may be avoided, while, additionally, the corresponding increase of series resistance at the drain side may be less pronounced due to the asymmetric provision of the substantially amorphized portions 206D, 206S, as shown in FIG. 2f. Furthermore, the shallow non-doping species 216 may be provided, possibly in an asymmetric manner, as previously discussed, and also the strain component 214 may be induced in the channel region 202A by a previously performed stress memorization technique. It should be appreciated that the device 200 as shown in FIG. 2g may be formed on the basis of process techniques, as also previously described, wherein the asymmetric configuration as shown in FIG. 2f may provide the desired transistor behavior. Furthermore, a metal silicide region 204D may be provided in the gate electrode structure 204 while respective metal silicide regions 210 may be formed in the drain and source regions 207, 208. For this purpose, well-established process techniques may be used.

Thereafter, the further processing may be continued by well-established strategies, for instance, by providing an interlayer dielectric material, possibly in a highly stressed state so as to further enhance the strain 214 followed by the formation of respective contact elements so as to connect to the drain and source regions 207, 208 and the gate electrode structure 204 as required by the overall circuit layout.

Consequently, also for the asymmetric transistor architecture, a significant reduction of the series resistance from the channel region 202A into the drain region 207 may be obtained on the basis of the substantially amorphized portion 206D that is laterally offset from the gate electrode structure 204 by means of a tilted implantation process.

Figure 2H:
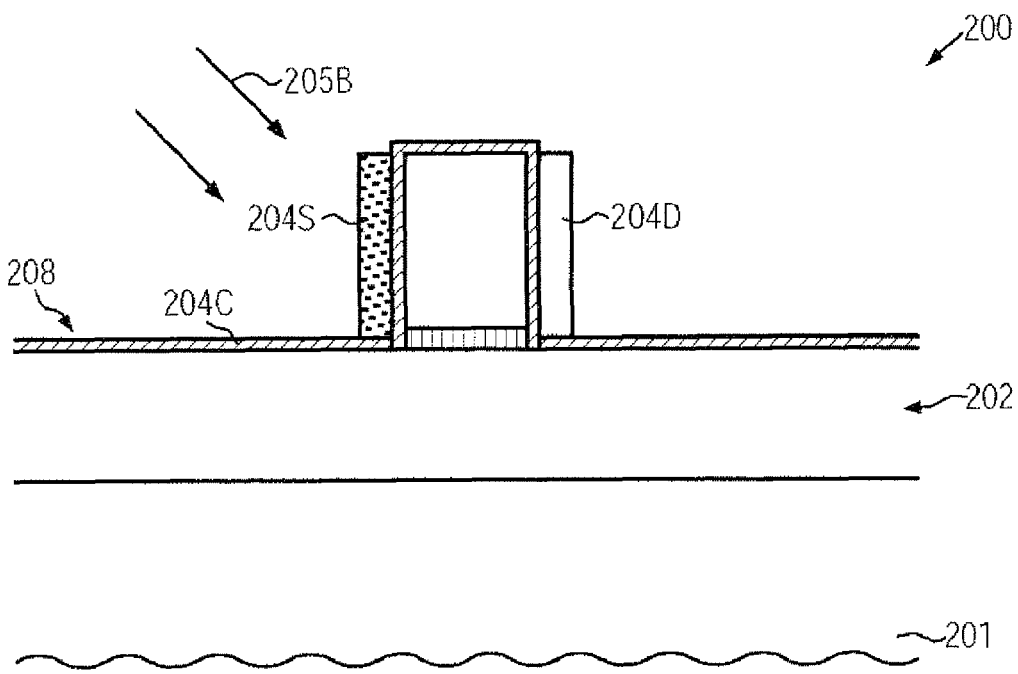
FIGS. 2h-2j schematically illustrate cross-sectional views of a transistor during various manufacturing stages in which an asymmetric configuration of the pre-amorphization implantation may be accomplished by an asymmetric provision of a non-electrode material of the gate electrode structure prior to performing the pre-amorphization implantation, according to still other illustrative embodiments.
Figure 2I:
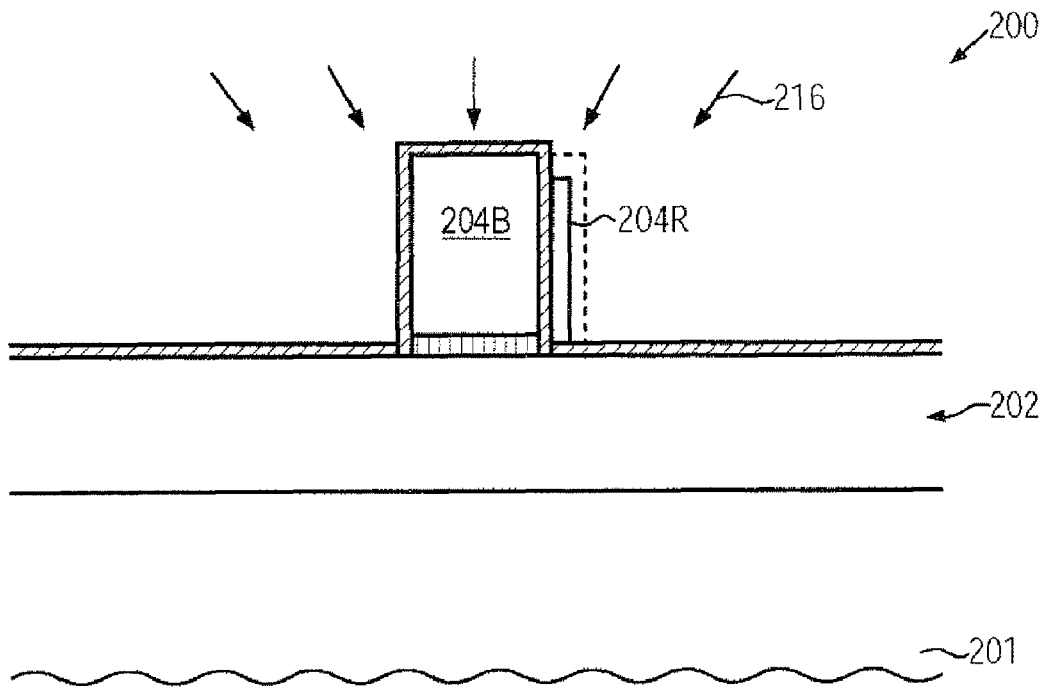
Figure 2J:
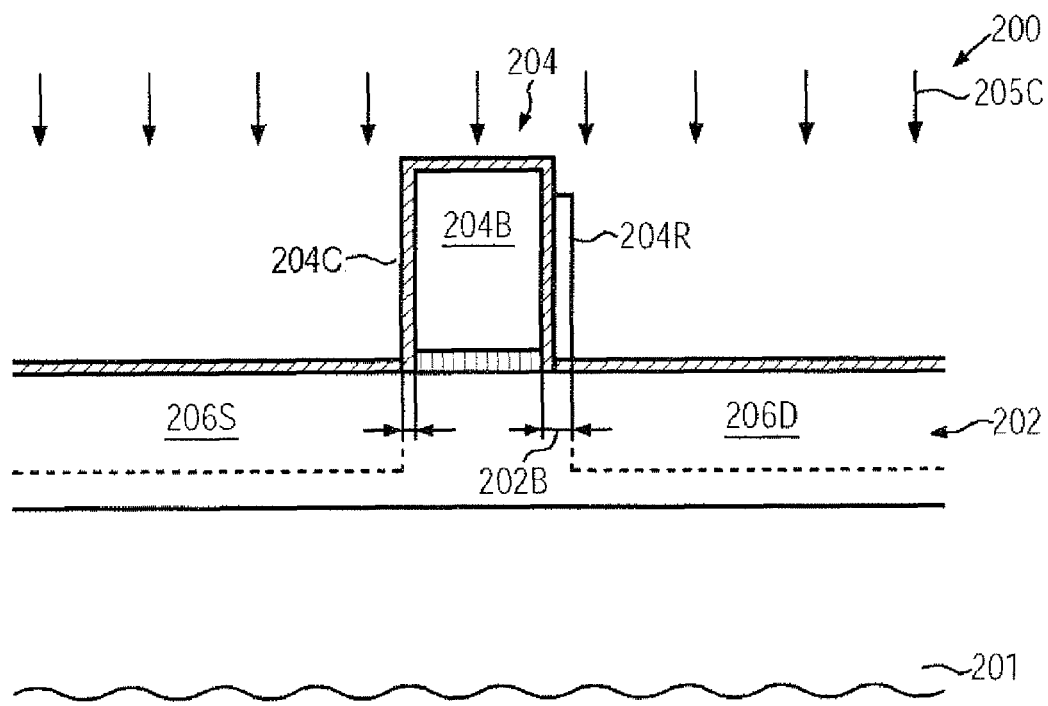

With reference to FIGS. 2h-2j, further illustrative embodiments will now be described in which a desired asymmetric lateral offset of the substantially amorphized region 206D may be accomplished on the basis of an asymmetrically provided non-electrode material of the gate electrode structure.

FIG. 2h schematically illustrates the transistor 200 in a manufacturing stage in which the gate electrode structure 204 may comprise a first spacer or non-electrode material 204S at the source side and a second spacer 204D at a drain side. Furthermore, in some illustrative embodiments, a further non-electrode material 204C may be provided, for instance, in the form of an etch stop material, such as silicon dioxide and the like. The spacers 204S, 204D may be provided in the form of any appropriate material, such as silicon nitride, silicon oxynitride and the like. The layer 204C may be formed, for instance, by oxidation, deposition and the like, while the spacers 204S, 204D may be formed by depositing an appropriate spacer material and anisotropically etching the same, wherein the optional layer 204C may act as an etch stop material. In some illustrative embodiments, after the deposition and prior to the patterning of the spacers 204S, 204D, the corresponding spacer layer may be treated, for instance, by ion implantation 205B, using a moderately high tilt angle, thereby creating significant damage in the corresponding material, in particular at sidewalls of the source side of the gate electrode structure 204, which may significantly alter the etch behavior. In this case, during the subsequent etch process for patterning the spacers 204S, 204D, an increased removal rate may be observed at the source side, thereby increasingly exposing the source side while maintaining a significant portion at the drain side. In other illustrative embodiments, as shown, the implantation 205B may be performed after the patterning of the spacers 204S, 204D, possibly in combination with a preceding tilted implantation process, thereby also locally increasing the etch rate of the spacer 204S.

FIG. 2i schematically illustrates the transistor 200 during an etch process 216 that may be performed as a wet chemical etch process or a plasma-assisted etch process in order to remove material of the spacers 204S, 204D, wherein the increased etch rate at the source side may result in a remaining spacer 204R of reduced dimensions, while the spacer 204S may be substantially completely removed. In other cases, a portion of the spacer 204S may also be maintained at the source side wherein, however, a ratio of the respective width may be adjusted so as to obtain a desired increased offset from the gate electrode 204B at the drain side during the subsequent processing, i.e., the creation of substantially amorphized regions.

FIG. 2j schematically illustrates the transistor 200 during an ion implantation process 205C, in which an amorphizing species may be introduced to form the substantially amorphized regions 206D, 206S having a different offset with respect to the gate electrode 204B. That is, as illustrated, the spacer 204R may provide a substantially non-damaged region 202B, the lateral dimensions of which are substantially determined by the width of the spacer 204R. On the other hand, the respective lateral offset of the region 206S may be substantially determined by the layer 204C, if provided, a thickness of which may be selected in accordance with device requirements and which may correspond to a desired offset according to conventional transistor architectures, if desired. Thus, the implantation process 205C may be performed on the basis of well-established process parameters without requiring a tilted implantation step. Thereafter, the further processing may be continued, for instance, by removing the spacer 204R, if a high degree of compatibility with conventional strategies in forming a symmetric or asymmetric transistor configuration is desired. In other illustrative embodiments, the spacer 204R may be maintained, at least during some of the subsequent implantation processes for forming the extension regions 207E, 208E (FIG. 2b), the halo regions 215D, 215S (FIG. 2f) and any further shallow non-doping implantation regions, thereby obtaining an asymmetric transistor configuration. Thereafter, the spacer 204R may be removed or may be maintained if a corresponding asymmetry with respect to deep drain and source regions may be desired. Furthermore, also respective stress memorization techniques may be applied, as previously explained.

As a result, the present disclosure provides techniques for reducing the series resistance of sophisticated transistor architectures by providing an increased offset between a substantially amorphized region at the drain side of the transistor with respect to the gate electrode structure to enhance the re-crystallization process thereof. This may be accomplished, in some illustrative embodiments, by a tilted pre-amorphization implantation process. Furthermore, stress memorization techniques may be applied for further enhancing overall transistor characteristics, while reducing an undesired increase of series resistance at the drain side for symmetric and asymmetric transistor architectures on the basis of the increased offset of the pre-amorphization implant region. Consequently, increased drive current may be achieved, in particular at the linear operating mode of the transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
forming a first substantially amorphized region in a source area and a second substantially amorphized region in a drain area of a semiconductor region having formed thereon a gate electrode structure comprising a gate electrode and a first non-electrode material formed on a first sidewall of the gate electrode facing a source side of said transistor and a second non-electrode material formed on a second sidewall facing a drain side of said transistor, a lateral distance of said second substantially amorphized region from said gate electrode being greater than a width of said first non-electrode material, wherein forming said first and second substantially amorphized regions comprises forming said second non-electrode material with a second width that is greater than said width, and performing an ion implantation process; and
forming drain and source regions in said semiconductor region by implanting at least one dopant species.

2. The method of claim 1, wherein forming said drain and source regions comprises introducing a first dopant species and a second dopant species, said first and second dopant species resulting in an opposite conductivity type.

3. The method of claim 2, wherein forming said drain and source regions further comprises introducing said first dopant species to form halo regions and introducing a portion of said second dopant species to form drain and source extension regions prior to forming a spacer structure for defining a lateral offset of deep drain and source regions.

4. The method of claim 1, wherein said drain and source regions are formed symmetrically with respect to a lateral offset to said gate electrode structure.

5. The method of claim 1, wherein said drain and source regions are formed asymmetrically with respect to a lateral offset to said gate electrode structure.

6. The method of claim 1, further comprising forming a cap layer above said transistor after forming said first and second substantially amorphized regions and performing an anneal process in the presence of said cap layer to re-crystallize said first and second substantially amorphized regions.

7. The method of claim 6, further comprising forming a spacer element from said cap layer after performing said anneal process.

8. The method of claim 1, further comprising introducing at least one non-doping ion species into said first and second substantially amorphized regions.

9. The method of claim 8, wherein said at least one non-doping portion is introduced in an asymmetrical manner with respect to a lateral offset to said gate electrode structure.

10. A method, comprising:
implanting an amorphizing species into a source area and a drain area of a transistor by using a tilt angle so as to obtain a lateral offset of said amorphizing species to a gate electrode structure at a drain side of said transistor; and
forming drain and source regions of said transistor, wherein forming said drain and source regions comprises forming a source extension region at least in a first substantially amorphized region at said source side and forming a drain extension region at least in a second substantially amorphized region at said drain side, wherein said source extension region and said drain extension region are formed symmetrically with respect to a lateral offset to said gate electrode structure.

11. The method of claim 10, further comprising forming a first halo region in said source side and a second halo region in said drain side after implanting said amorphizing species.

12. The method of claim 11, wherein said first and second halo regions are formed asymmetrically with respect to a lateral offset to said gate electrode structure.

13. The method of claim 11, wherein said first and second halo regions are formed symmetrically with respect to a lateral offset to said gate electrode structure.

14. The method of claim 10, further comprising forming a cap layer above said transistor after implanting said amorphizing species and annealing said transistor in the presence of said cap layer to reduce implantation-induced lattice damage in said source and drain areas.

15. A method, comprising:
forming a first substantially amorphized region and a second substantially amorphized region in a semiconductor region having formed thereon a gate electrode structure, said first and second substantially amorphized regions being asymmetric with respect to a lateral offset to said gate electrode structure;

forming drain and source regions in said semiconductor region;

forming a cap layer above said semiconductor region; and annealing said semiconductor region in the presence of said cap layer to substantially re-crystallize implantation-induced lattice damage in said first and second substantially amorphized regions.

16. The method of claim 15, wherein said first and second substantially amorphized regions are formed by a tilted ion beam.

17. The method of claim 15, wherein forming said drain and source regions comprises forming drain and source extension regions asymmetrically with respect to a lateral offset to said gate electrode structure.

18. The method of claim 15, wherein forming said drain and source regions comprises forming drain and source extension regions symmetrically with respect to a lateral offset to said gate electrode structure.

19. The method of claim 14, further comprising forming a spacer element from said cap layer after performing said anneal process.

20. The method of claim 15, further comprising forming a spacer element from said cap layer after performing said anneal process.

* * * * *